US005798202A

United States Patent [19]

Cushner et al.

[11] Patent Number: 5,798,202

[45] Date of Patent: Aug. 25, 1998

[54] LASER ENGRAVABLE SINGLE-LAYER FLEXOGRAPHIC PRINTING ELEMENT

[75] Inventors: Stephen Cushner, Lincroft; Roxy Ni Fan, East Brunswick, both of N.J.; Ernst Leberzammer, Glen Mills, Pa.; Paul Thomas Shea, Freehold, N.J.; Carol Marie Van Zoeren, Wilmington, Del.

[73] Assignee: E. I. duPont de Nemours and Company, Wilmington, Del.

[21] Appl. No.: 880,792

[22] Filed: May 11, 1992

[51] Int. Cl.$^{6}$ ........................ G03F 7/00

[52] U.S. Cl. .................. 430/306; 430/286.1; 430/270.1; 430/297; 430/945; 101/453; 101/470

[58] Field of Search .................. 430/270.1, 286.1, 430/306, 297, 945; 101/470, 453

[56] References Cited

U.S. PATENT DOCUMENTS

| | | | |
|---|---|---|---|
| 2,014,043 | 9/1935 | Harbison et al. | 101/379 |
| 3,549,733 | 12/1970 | Caddell | 264/25 |
| 3,574,657 | 4/1971 | Burnett | 430/302 |
| 3,975,761 | 8/1976 | Taudt et al. | 358/78 |
| 3,991,673 | 11/1976 | Coale et al. | 101/395 |
| 4,108,659 | 8/1978 | Dini | 96/36.3 |
| 4,156,124 | 5/1979 | Macken et al. | 358/299 |
| 4,162,919 | 7/1979 | Richter et al. | 96/87 R |
| 4,232,345 | 11/1980 | Zollman et al. | 358/299 |
| 4,245,003 | 1/1981 | Oransky et al. | 428/323 |
| 4,264,705 | 4/1981 | Allen | 430/286 |
| 4,323,928 | 4/1982 | Zollman et al. | 358/299 |
| 4,347,785 | 9/1982 | Chase et al. | 101/1 |
| 4,388,865 | 6/1983 | Kellner | 101/401.1 |
| 4,390,903 | 6/1983 | Pomeroy | 358/282 |
| 4,528,909 | 7/1985 | Rigg et al. | 101/395 |
| 4,806,506 | 2/1989 | Gibson | 430/328 |
| 4,907,508 | 3/1990 | Patschorke | 101/401.1 |
| 4,912,824 | 4/1990 | Baran | 29/121.2 |
| 4,947,022 | 8/1990 | Ostroff et al. | 219/121.68 |
| 4,994,344 | 2/1991 | Kurtz et al. | 430/273 |
| 5,047,116 | 9/1991 | Luthi et al. | 156/643 |
| 5,259,311 | 11/1993 | McCaughey, Jr. | 101/401.1 |

FOREIGN PATENT DOCUMENTS

| | | | |
|---|---|---|---|
| 0 315 152 A2 | 5/1989 | European Pat. Off. | G03F 7/26 |
| 2 223 984 | 4/1990 | United Kingdom . | |

OTHER PUBLICATIONS

Odian, G., *Principles of Polymerization*, 1970, pp. 194–211.

Flexo, pp. 6–46 (Dec. 1990). P.W. Sharkey, "Laser–Engraved Anilex Rolls".

Culkin et al., Designer's Handbook, Industrial Lasers, Parts 1 & 2, Photonics Spectra, pp. 57,58,60,62,63,69,70,72,74, 76,78,80 and 82 (Oct. 1987).

Grapholas, Product Literature from Baasel Lasertech (Circa Dec. 1988).

Euro Flexo Magazine, pp. 8, 10 (Nov. 1990).

Lambdaphysik, pp. 8, 10 and 5 (Jun. 1990).

*Primary Examiner*—Rachel Gorr

*Attorney, Agent, or Firm*—Thomas H. Magee

[57] ABSTRACT

A process for making a single layer flexographic printing plate which involves reinforcing and laser engraving a single layer flexographic printing element.

6 Claims, No Drawings

LASER ENGRAVABLE SINGLE-LAYER FLEXOGRAPHIC PRINTING ELEMENT

FIELD OF THE INVENTION

This invention relates to a process for making flexographic printing plates and, in particular, to a process for making laser engraved single layer, flexographic printing plates and also of concern are laser engravable single layer flexographic printing elements.

BACKGROUND OF THE INVENTION

Printing plates are well known for use in flexographic printing, particularly on surfaces which are corrugated or smooth, such as packaging materials, e.g., cardboard, plastic films, etc.

Typically, flexographic printing plates which have heretofore been used are those made from vulcanized rubber. Rubber was favored because it could be used with harsh solvents, it had good ink transfer, high elasticity, and high compressibility. Rubber elements were made by vulcanizing the rubber in a suitable mold.

More recently, it has been possible to laser engrave a rubber element directly. Laser engraving has provided a wide variety of opportunities to rubber printing plates. Highly concentrated and controllable energy lasers can engrave very fine details in rubber. The relief of the printing plate can be varied in many ways. Very steep as well as gently decreasing relief slopes can be engraved so as to influence the dot gain of such plates.

Commercial rubbers can be natural or synthetic. An example of synthetic rubber includes ethylene-propylene-diene monomer elastomers (EPDM), which can be used to make a laser engravable flexographic printing element. Elements made from natural or synthetic rubbers require vulcanization with sulfur, a sulfur-containing moiety, or peroxide to effect chemical crosslinking. Such materials will hereinafter be referred to as "rubber". In addition, such vulcanized elements require grinding to obtain uniform thickness and a smooth surface suitable for printing. This is extremely time consuming and labor intensive.

U.S. Pat. No. 3,549,733 issued to Caddell on Dec. 22, 1970, describes a method for producing polymeric printing plates. The printing plate is made by exposing a layer of the polymeric material to a controlled laser beam of sufficient intensity to ablate the polymer and form depressions in the surface.

SUMMARY OF THE INVENTION

This invention relates to a process for making a single layer flexographic printing plate which comprises (a) reinforcing an elastomeric layer situated on top of a flexible support to produce a laser engravable flexographic printing element which optionally has a removable coversheet situated on top of the elastomeric layer, said reinforcement being selected from the group consisting of mechanical, photochemical and thermochemical reinforcement, or a combination thereof, provided that thermochemical reinforcement is accomplished using a crosslinker other than sulfur, a sulfur-containing moiety, or peroxide; and (b) laser engraving the laser engravable element of step (a) with at least one preselected pattern to produce a laser engraved flexographic printing plate provided that the coversheet is removed prior to laser engraving if a coversheet is present.

In a second embodiment, this invention relates to a single layer, laser engravable flexographic printing element which comprises (a) a flexible support; and (b) a laser engravable, reinforced elastomeric layer wherein said layer has been singly reinforced mechanically or thermochemically or multiply reinforced mechanically and photochemically, mechanically and thermochemically, or photochemically and thermochemically, or mechanically, photochemically and thermochemically provided that thermochemical reinforcement is accomplished using a crosslinker other than sulfur, a sulfur containing moiety, or peroxide.

In a third embodiment, this invention relates to a single layer, laser engravable flexographic printing element which comprises (a) a flexible support; and (b) a laser engravable, reinforced elastomeric layer wherein said layer comprises at least one thermoplastic elastomer, said layer being singly reinforced mechanically or thermochemically or multiply reinforced mechanically and photochemically, mechanically and thermochemically, photochemically and thermochemically or mechanically, photochemically and thermochemically.

DETAILED DESCRIPTION OF THE INVENTION

Lasers can develop sufficient power densities to ablate certain materials. Lasers such as high-power carbon dioxide lasers can ablate many materials such as wood, plastic and rubber. Once the output from a laser is focused at a particular point on a substrate with a suitable power density, it is possible to remove material in depth from an organic solid to create a relief. Areas not struck by the laser beam are not removed. Thus, the use of the laser offers the potential of producing very intricate engravings in the proper material.

The term "laser engravable" as used herein refers to reinforced materials capable of absorbing laser radiation such that those areas of the materials which are exposed to a laser beam of sufficient intensity become physically detached with sufficient resolution and relief depth to be suitable for flexographic applications. It will be understood that if the laser radiation is not absorbed by the reinforced material directly, then it may be necessary to add a laser radiation absorbing component as described below. By "physically detached", it is meant that the material so exposed is either removed or is capable of being removed by any mechanical means such as by vacuum cleaning or washing or by directing a stream of gas across the surface to remove the loosened particles.

The term "single layer" as used herein means that a single reinforced elastomeric layer is situated on top of the support or between a support and a coversheet if one is used. In addition, this term also encompasses elements wherein the single layer is produced by building up layers of the same composition.

Surprisingly and unexpectedly, it has been found that by reinforcing and laser engraving a single layer flexographic printing element, a viable flexographic printing plate can be produced. This was surprising and unexpected because these elements do not possess the toughness of conventional rubber printing elements. It was expected that such non-rubber printing elements would melt too much during the laser engraving process and, thus, produce poor quality and low resolution images on the plate. Accordingly, the process and elements of instant invention provide an alternative to laser engravable rubber flexographic printing elements to produce flexographic printing plates with the high image resolution required for the packaging industry.

The process and single layer laser engravable flexographic printing elements utilize elastomeric materials which do not require tedious vulcanization and grinding steps are necessary to achieve uniform thickness. Such elements of uniform thickness can be prepared by a variety of methods such as extrusion and calendering lamination, molding, spraying, or dip coating. In addition, no treatment with noxious sulfur or sulfur-containing crosslinkers is required.

These elastomeric materials can be used to particular advantage in the formation of seamless, continuous printing elements. The flat sheet elements can be reprocessed by wrapping the element around a cylindrical form, usually a printing sleeve or the printing cylinder itself, and fusing the edges together to form a seamless, continuous element. Such fusion is not possible with rubber plates because the vulcanized rubber is irreversibly crosslinked and, thus, cannot dissolve or melt unless the network structure is destroyed.

These continuous printing elements have applications in the flexographic printing of continuous designs such as in wallpaper, decoration and gift wrapping paper. Furthermore, such continuous printing elements are well-suited for mounting on conventional laser engraving equipment. The sleeve or cylinder on which the printing element is wrapped when the edges are fused, can be mounted directly into the laser engraving apparatus where it functions as the rotating drum during the engraving process.

Unless otherwise indicated, the term "single layer, laser engravable flexographic element" encompasses plates or elements in any form suitable for flexographic printing, including, but not limited to, flat sheets and seamless continuous forms.

Another advantage in working with the process and single layer, laser engravable flexographic printing elements of the invention is that the noxious odors associated with conventional rubber plates are minimized during laser engraving.

An advantage of the single layer elements of the invention is that they possess dimensional stability due to the presence of a flexible support.

The process and elements of the invention are made from elastomeric materials which can be reinforced using at least one type of reinforcement selected from the group consisting of mechanical, photochemical, and thermochemical reinforcement, or a combination thereof, provided that thermochemical reinforcement is accomplished using a crosslinker other than sulfur, a sulfur-containing moiety or peroxide, to produce an elastomeric layer suitable for laser engraving as is described below. Such reinforcement is a very important factor in utilizing the process and single layer, laser engravable flexographic printing elements of the invention.

The process of the invention for making a single layer flexographic printing plate comprises (a) reinforcing an elastomeric layer situated on top of a flexible support to produce a laser engravable flexographic printing element which optionally has a removable coversheet situated on top of the elastomeric layer, said reinforcement being selected from the group consisting of mechanical, photochemical and thermochemical reinforcement, or a combination thereof, provided that thermochemical reinforcement is accomplished using a crosslinker other than sulfur, a sulfur-containing moiety, or peroxide; and (b) laser engraving the laser engravable element of step (a) with at least one preselected pattern to produce a laser engraved flexographic printing plate provided that the coversheet is removed prior to laser engraving if a coversheet is present.

Suitable elastomeric materials should be chosen so that the resulting element can be laser engraved as discussed below. In addition, the resulting plate should have the characteristics associated with flexographic printing. These characteristics include flexibility, resilience, Shore A hardness, ink compatibility, ozone resistance, durability and resolution. It is also preferred, but not essential, that such materials do not incorporate halogens or heteroatoms such as sulfur so as to avoid any toxic gases being emitted during the laser engraving process. Thus, either a single elastomeric material or a combination of materials can be used so long as the characteristics desired for flexography are obtained.

Examples of such elastomeric materials are described in *Plastics Technology Handbook*, Chandler et al., Ed., (1987), the disclosure of which is hereby incorporated by reference. This includes, but is not limited to, elastomeric materials such as copolymers of butadiene and styrene, copolymers of isoprene and styrene, styrene-diene-styrene triblock copolymers, etc. Certain of these block copolymers have been described in U.S. Pat. Nos. 4,323,636, 4,430,417 and 4,045,231, the disclosures of which are hereby incorporated by reference. These triblock copolymers can be divided into three basic types of polymers: polystyrene-polybutadiene-polystyrene (SBS), polystyrene-polyisoprene-polystyrene (SIS), or polystyrene-poly(ethylenebutylene)-polystyrene (SEBS).

There can also be mentioned non-crosslinked polybutadiene and polyisoprene; nitrile elastomers; polychloroprene; polyisobutylene and other butyl elastomers; chlorosulfonated polyethylene; polysulfide; polyalkylene oxides; polyphosphazenes; elastomeric polymers and copolymers of acrylates and methacrylates; elastomeric polyurethanes and polyesters; elastomeric polymers and copolymers of olefins such as ethylene-propylene copolymers and non-crosslinked EPDM; elastomeric copolymers of vinyl acetate and its partially hydrogenated derivatives. The term elastomer, as used herein, encompasses core shell microgels and blends of microgels and preformed macromolecular polymers, such as those disclosed in Fryd et al., U.S. Pat. No. 4,956,252, and U.S. Pat. No. 5,075,192 the disclosures of which are hereby incorporated by reference.

In many cases, it may be desirable to use thermoplastic elastomers to formulate the elastomeric layer. When a thermoplastic elastomer layer is singly reinforced mechanically, it remains thermoplastic. However, when a thermoplastic elastomeric layer is reinforced photochemically or thermochemically, either singly or in combination with other types of reinforcement, then the layer remains elastomeric but is no longer thermoplastic after such reinforcement.

Mechanical reinforcement can be accomplished by incorporating materials called reinforcing agents. Such materials enhance mechanical properties of elastomeric materials like tensile strength, stiffness, tear resistance, and abrasion resistance. In order to be considered as a mechanical reinforcing agent in the process and elements of the present invention, an additive must modify the elastomeric material such that it can be laser engraved to produce a flexographic printing plate, irrespective of the effect of the additive on other mechanical properties. It will be understood that the additives which can be used as reinforcing agents will vary depending on the composition of the elastomeric material. Thus, materials which are reinforcing agents in one elastomer, may not function as reinforcing agents in another elastomer.

The reinforcing agent is, generally, a particulate material, although not all materials can serve as a reinforcing agent. Selection of a suitable reinforcing agent depends on the elastomeric material. Examples of such agents can include but are not limited to finely divided particles of carbon black, silica, $TiO_2$, calcium carbonate and calcium silicate, barium sulfate, graphite, mica, aluminum and alumina.

Increasing the amount of reinforcing agent causes a concomitant improvement in the laser engravability and the mechanical properties of the elastomer until a maximum is reached which represents the optimum loading for a particular composition. Beyond this point, the properties of the elastomeric material will deteriorate.

The effectiveness of the reinforcing agent also depends on the particle size and the tendency of the material to agglomerate or form chains. In general, tensile strength, abrasion and tear resistance, hardness and toughness increase with decreasing particle size. When carbon black is used as the reinforcing agent, the particle size is usually between 200 and 500 Å in diameter. For other reinforcing agents, particle sizes up to a few micrometers in diameter can be used. Reinforcing agents which tend to form agglomerates or chains are more difficult to disperse in the elastomer and result in materials having higher stiffness and hardness, but low tensile strength and toughness.

Photochemical reinforcement is accomplished by incorporating photohardenable materials into the elastomeric layer and exposing the layer to actinic radiation. Photohardenable materials are well known and include photocrosslinkable or photopolymerizable systems, or combinations thereof. Photocrosslinking generally occurs by crosslinking a preformed polymer to form a substantially insoluble crosslinked polymeric network. This can occur either through dimerization of pendant reactive groups attached directly to the polymer chain, or reaction of the polymer with a separate polyfunctional photoactive crosslinking agent. Photopolymerization generally occurs when relatively low molecular weight monomers or oligomers undergo photoinitiated cationic or free radical polymerization to form substantially insoluble polymers. In some systems, both photocrosslinking and photopolymerization can occur.

Photohardenable materials which can be incorporated into an elastomer generally comprise a photoinitiator or photoinitiator system (hereinafter referred to as "photoinitiator system") and one of (i) a low molecular weight monomer or oligomer capable of undergoing polymerization, (ii) reactive groups pendant to the elastomer which are capable of reacting with each other or (iii) reactive groups pendant to the elastomer and a crosslinking agent capable of reacting with the reactive groups.

The photoinitiator system is one which, upon irradiation with actinic radiation forms a species which will initiate either free radical or cationic crosslinking or polymerization reactions. By actinic radiation, it is meant high energy radiation including but not limited to UV, visible, electron beam, and X-ray. Most photoinitiator systems for free radical reactions in current use are based upon one of two mechanisms: photofragmentation and photoinduced hydrogen abstraction. Suitable photoinitiator systems of the first type include peroxides, such as benzoyl peroxide; azo compounds, such as 2,2'-azobis(butyronitrile); benzoin derivatives, such as benzoin and benzoin methyl ether;

derivatives of acetophenone, such as 2,2-dimethoxy-2-phenylacetophenone; ketoxime esters of benzoin; triazines; and biimidazoles. Suitable photoinitiator systems of the second type include anthraquinone and a hydrogen donor; benzophenone and tertiary amines; Michler's ketone alone and with benzophenone; thioxanthones; and 3-ketocoumarins.

Photoinitiator systems suitable for cationic crosslinking or polymerization reactions are those which, upon irradiation, produce a Lewis acid or a protonic Bronsted acid which is capable of initiating polymerization of ethylene oxide or epoxy derivatives. Most photoinitiator systems of this type are onium salts, such as diazonium, iodonium and sulfonium salts.

Sensitizing agents can also be included with the photoinitiator systems discussed above. In general, sensitizing agents are those materials which absorb radiation at a wavelength different than that of the reaction-initiating component, and are capable of transferring the absorbed energy to that component. Thus, the wavelength of the activating radiation can be adjusted.

As mentioned above, the elastomer can have pendant groups which are capable of undergoing free-radical induced or cationic crosslinking reactions. Pendant groups which are capable of undergoing free-radical induced crosslinking reactions are generally those which contain sites of ethylenic unsaturation, such as mono- and polyunsaturated alkyl groups; acrylic and methacrylic acids and esters. In some cases, the pendant crosslinking group can itself be photosensitive, as is the case with pendant cinnamoyl or N-alkyl stilbazolium groups. Pendant groups which are capable of undergoing cationic crosslinking reactions include substituted and unsubstituted epoxide and aziridine groups.

An additional polyfunctional crosslinking agent can be added to react with the pendant reactive groups. Examples of such crosslinking agents include the polyfunctional monomers discussed below.

Monomers undergoing free-radical polymerization are typically ethylenically unsaturated compounds. Examples of monofunctional compounds include acrylate and methacrylate esters of alcohols and their low molecular weight oligomers. Examples of suitable monomers and oligomers with two or more sites of unsaturation capable of undergoing free-radical induced addition reactions include the polyacrylate and polymethacrylate esters of polyols such as triethyleneglycol, trimethylolpropane, 1,6-hexanediol, and pentaerythritol, and their low molecular weight oligomers. Esters of ethoxylated trimethyolol propane, in which each hydroxyl group has been reacted with several molecules of ethylene oxide, as well as monomers derived from bisphenol A diglycidyl ether and monomers derived from urethanes have also been used. Monomers which undergo cationic polymerization include mono- and polyfunctional epoxides and aziridines. In some cases, where there are residual reactive sites in the binder, e.g., residual unsaturation or epoxide groups, the crosslinking agent can also react with the binder.

Examples of photocrosslinkable and photopolymerizable systems have been discussed in detail in several references, e.g., A. Reiser in *Photoreactive Polymers* (John Wiley & Sons, New York 1989), J. Kosar in *Light-Sensitive Systems* (John Wiley & Sons, New York 1965), Chen et al., U.S. Pat. No. 4,323,637, Gruetzmacher et al., U.S. Pat. No. 4,427,759 and Feinberg et al., U.S. Pat. No. 4,894,315, the disclosures of which are hereby incorporated by reference.

Thermochemical reinforcement is accomplished by incorporating materials, which undergo hardening reactions when exposed to heat, into the elastomer. One type of thermochemically hardenable material is analogous to the photochemically hardenable material described above, and comprises a thermal initiator system and a monomer or oligomer which can undergo free-radical addition reactions. The thermal initiator system generally employs an organic peroxide or hydroperoxide, such as benzoyl peroxide. Suitable monomers and oligomers include the monofunctional and polyfunctional compounds described above in connection with the photohardenable systems. Strictly speaking, many of these monomers undergo polymerization and crosslinking reactions when heated even in the absence of thermal initiator systems. However, such reactions are less controllable, and it is generally preferred to include a thermal initiator system.

A second type of thermochemically hardenable material comprises a thermosetting resin, optionally with a catalyst such as a Lewis acid or base. The heating step must take place at a temperature which does not deleteriously affect the elastomer. Types of thermosetting resins which can be used include phenol-formaldehyde resins such as novolacs and resoles; urea-formaldehyde and melamine-formaldehyde resins; saturated and unsaturated polyester resins; epoxy resins; urethane resins; and alkyd resins. Such resins, and suitable catalysts for them, are well known in the art.

In a third type of thermochemically hardenable material the elastomer has reactive pendant groups which, when heated, (i) react with each other to form crosslinked networks or (ii) react with a crosslinking agent. Both type (i) and type (ii) can optionally contain a catalyst. Examples of types of reactive groups which can be used, both pendant to the elastomer and in a separate crosslinking agent, include amino and acid or acid anhydride groups which react to form amide linkages; alcohol and acid or acid anhydride groups which react to form ester linkages; isocyanate and alcohol groups which react to form urethane linkages; dianhydride and amino groups which react to form an imide linkage; etc. Thermochemical reinforcement as described herein does not involve using a crosslinker such as sulfur, a sulfur-containing moiety or a peroxide. However, it will be understood that peroxides can be used as a photo- or thermal initiator as described above.

In some cases, the elastomeric material can be multiply reinforced such as by mechanical reinforcement and additionally by photochemical or thermochemical reinforcement or by both photochemical and thermochemical reinforcement. It may even be desirable to use mechanical, photochemical and thermochemical reinforcement.

In a second embodiment, this invention concerns a laser engravable, single layer flexographic printing element which comprises (a) a flexible support; and (b) a laser engravable, reinforced elastomeric layer wherein said layer has been singly reinforced mechanically or thermochemically or multiply reinforced mechanically and photochemically, mechanically and thermochemically, or photochemically and thermochemically, or mechanically, photochemically and thermochemically provided that thermochemical reinforcement is accomplished using a crosslinker other than sulfur, a sulfur containing moiety, or peroxide.

In a third embodiment, this invention concerns a laser engravable, single layer flexographic printing element which comprises (a) a flexible support; and (b) a laser engravable, reinforced elastomeric layer wherein said layer comprises at least one thermoplastic elastomer, said layer being singly reinforced mechanically or thermochemically or multiply reinforced mechanically and photochemically, mechanically and thermochemically, photochemically and thermochemically or mechanically, photochemically and thermochemically.

An advantage in working with the preferred elements of the invention is that because they can be formulated from thermoplastic elastomeric materials they allow for an efficient production of elements of uniform thickness by extrusion and calendering. Thus, a significant cost savings can be realized through a much simpler manufacturing process, one which does not include tedious, time-consuming vulcanization and grinding.

Laser engraving involves the absorption of laser radiation, localized heating and removal of material in three dimensions and is an extremely complex process. Thus, laser engraving of at least one preselected pattern into a reinforced single layer element is quite complex.

The pattern can be one which results in the printing of a single image. The same image can be engraved on the printing element more than once, in a so-called "step-and-repeat" procedure. The element can also be engraved with two or more different patterns to print two or more separate and different images or to create a composite image. The pattern itself can be, for example, in the form of dots or linework generated by a computer, in a form obtained by scanning the artwork, in the form of a digitized image taken from original artwork, or a combination of any of these forms which can be electronically combined on a computer prior to laser engraving.

An advantage associated with the laser engraving process is an ability to utilize information in digital form. The image to be printed can be converted into digital information which is used to modulate the laser during the engraving process. The digital information can even be transmitted from a distant location. Corrections can be made easily and quickly by adjusting the digitized image.

The laser engraving process of the invention does not involve the use of a mask or stencil. This is because the laser impinges the sample to be engraved at or near its focus spot. Thus, the smallest feature that can be engraved is dictated by the laser beam itself. The laser beam and the material to be engraved are in constant motion with respect to each other, such that each minute area of the plate ("pixel") is individually addressed by the laser. The image information is fed into this type of system directly from the computer as digital data, rather than via a stencil.

Factors to be considered when laser engraving include, but are not limited to, deposition of energy into the depth of the element, thermal dissipation, melting, vaporization, thermally induced chemical reactions such as oxidation, presence of air-borne material over the surface of the element being engraved, and mechanical ejection of material from the element being engraved. Investigative efforts with respect to engraving of metals and ceramic materials with a focused laser beam have demonstrated that engraving efficiency (the volume of material removed per unit of laser energy) and precision are strongly intertwined with the characteristics of the material to be engraved and the conditions under which laser engraving will occur.

Similar complexities come into play when engraving elastomeric materials even though such materials are quite different from metals and ceramic materials.

Laser engravable materials usually exhibit some sort of intensity threshold, below which no material will be removed. Below the threshold it appears that laser energy deposited into the material is dissipated before the vaporization temperature of the material is reached. This threshold can be quite high for metals and ceramic materials. However, with respect to elastomeric materials it can be quite low. Above this threshold, the rate of energy input competes quite well with opposing energy loss mechanisms such as thermal dissipation. The dissipated energy near, though not in, the illuminated area may be sufficient to vaporize the material and, thus, the engraved features become wider and deeper. This effect is more pronounced with materials having low melting temperatures.

When laser engraving at higher intensities, material can become ionized which means that it has been excited well beyond the threshold needed to laser engrave. In addition, significant amounts of air-borne substances can be quickly generated over the surface which can impede the radiation from reaching the surface of the material. Examples of such substances which can form a high absorbing "cloud" or even a plasma of ionized particles include vapor, ash, ions, etc.

One basic parameter which must be considered is the choice of laser. Some lasers such as a carbon dioxide laser or the infrared-emitting solid state lasers operate in continuous-wave (CW) and pulsed mode. Another type of laser is the excimer laser which produces (10–15 nsec) high-average, peak power (100–150 megawatts) pulses in the ultraviolet portion of the spectrum (approximately 200–300 nm) and can be operated only in the pulsed mode. Ablation of polymeric materials by excimer laser is commonly used to create patterned relief features for microelectronics, for example. In that case, the excimer beam is relatively large, and is passed through an image-bearing stencil or mask. An excimer could be focused to a single spot. However, the maximum modulation rate of an excimer laser is only on the order of a few kHz. This limits the rate at which each pixel may be engraved, leading to long access times to a whole plate. This access time limitation renders the excimer inappropriate for commercial use in this application. Still another laser that can be used is a semiconductor diode laser which can be operated in either CW or pulsed mode. Such lasers have considerably lower power output compared to the lasers discussed above. However, because the laser engravable flexographic elements described herein have such a low threshold to engraving, even these diode lasers can be used. At the present time, the lasers which have commercial significance for engraving flexographic printing elements are the $CO_2$ laser and the infrared-emitting solid state lasers, e.g., the Nd:YAG laser.

Significant differences have been observed between engraving in a CW mode versus a pulsed mode. One possible explanation is due to thermal dissipation. When engraving in a CW mode, material has a "thermal history" so that to the temporal and spatial extent of thermal dissipation, engraving effects are cumulative. In contrast, thermal dissipation in the pulsed mode results in a minimal thermal history due to the time interval between pulses.

Consequently, at low or moderate radiation intensities, pulsed engraving may be less efficient. Energy which might heat, even melt the material, but not vaporize it or otherwise cause it to become physically detached is lost. On the other hand, CW irradiation at low or moderate intensities is accumulated in a given area while the beam scans the vicinity of that area. Thus, at low intensities, CW may be the preferred mode. Pulsed mode may be the preferred mode at high intensities because if a cloud of radiation absorbing material were formed, there would be time for it to dissipate in the time interval between pulses and, thus, it would permit a more efficient delivery of radiation to the solid surface. Those skilled in the art will appreciate that as the pulse repetition period approaches the thermal dissipation time or the time for the plasma to dissipate, the material integrates the input energy over that time and the pulsed engraving mode may become indistinguishable from CW mode.

Engraving of nonmetals is a thermally induced process in which the energy of a focused beam of light is absorbed by the host material. Since a laser beam represents energy in the form of light, it is important that the material that is to be laser engraved has the capability of transforming the light energy into thermal energy via an absorption mechanism.

Carbon dioxide lasers operate around an approximately ten (10) micrometer wavelength whereas infrared emitting solid state lasers, such as the Nd:YAG laser, operate around an approximately one (1) micrometer wavelength.

Generally, elastomers themselves are capable of absorbing radiation around ten (10) micrometers and, thus, do not require an additional laser radiation absorbing component in order to engrave with a carbon dioxide laser. However, it may be desirable to use such a laser radiation absorbing component.

In contrast, elastomers are generally not capable of absorbing radiation around one (1) micrometer and, thus, usually require at least one component capable of absorbing the light energy generated by a near infrared emitting solid state laser, i.e., a laser radiation absorbing component, in order to be engraved at that wavelength.

Absorptivity of the material has a number of effects, one of which is an impact on the engraving result by affecting the penetration depth of the radiation, i.e., the depth to which energy is deposited. When significant radiation penetrates well below the surface, vaporized material can be effectively trapped and will not become physically detached. Energy absorbed below the surface will be dissipated either thermally or mechanically into the bulk of the material. By mechanically it is meant that there can be sudden expansion of subsurface material leading to deformation throughout the bulk and at the surface. Image quality and print characteristics of the resulting printing plate are compromised. Similarly, high intensity can also deposit energy well below the surface to create such problems.

One possibility is that the deep relief is not achieved by instant excitation throughout the bulk followed by expulsion of material from the bulk. Rather, it appears that a more "steady state" process is involved wherein radiation is absorbed at the surface which causes the surface material to become physically detached by melting, vaporizing, and/or oxidizing. A new recessed surface of molten material is revealed which absorbs radiation and is ejected. Thus, absorptivity affects the thickness of this receding "skin depth" as well as the spatial extent of thermal excitation below this "skin" and into the bulk.

Examples of laser radiation absorbing components suitable to increase absorptivity of a material for a near-infrared emitting solid state laser include infrared absorbing dyes and pigments. These components can be used alone or in combination with other radiation absorbing components and/or other constituents depending upon the objectives to be achieved as is discussed below. Suitable dyes which can be used alone or in combination include poly(substituted) phthalocyanine compounds and metal-containing phthalocyanine compounds; cyanine dyes; squarylium dyes; chalcogenopyryloarylidene dyes; croconium dyes; metal thiolate dyes; bis(chalcogenopyrylo)polymethine dyes; oxyindolizine dyes; bis(aminoaryl)polymethine dyes; merocyanine dyes; and quinoid dyes. Finely divided particles of metals such as aluminum, copper or zinc can also be used either alone or in combination with other radiation absorbing components. Suitable pigments which can be used alone or in combination include carbon black, graphite, copper chromite, chromium oxides, cobalt chrome aluminate, and other dark inorganic pigments. A preferred pigment is carbon black.

It will be noted that some laser radiation absorbing components can also serve as reinforcing agents in mechanically reinforced elastomeric elements. Carbon black is particularly preferred in this dual function. In addition, some laser radiation absorbing components such as carbon black, the dark inorganic pigments and finely divided metal particles can also serve as a thermal agent, affecting the heat capacity, thermal diffusion and other characteristics of the material which significantly impact the engraving efficiency, relief depth, and image quality.

The preferred laser radiation absorbing component for all lasers (carbon dioxide, near infrared emitting solid state, diode or excimer) is carbon black.

Thus, those skilled in the art will appreciate that if a laser radiation absorbing component or components are needed, then the amount of such component or components used should be determined taking into account the variety of ways in which this component or components can impact the engraving process and the resulting printing plate.

In addition to the foregoing, other additives can be added to the elastomeric material depending on the desired properties. Such additives include plasticizers, antioxidants, adhesion promoters, rheology modifiers, antiozonants, dyes and colorants, and non-reinforcing fillers.

The thickness of the elastomeric material can vary over a wide range depending upon the type of printing plate desired. For so called "thin plates", the elastomeric layer can be from about 20 to 60 mils (0.05 to 0.15 cm) in thickness. Thicker plates will have a elastomeric layer of 100–250 mils (0.25 to 0.64 cm) in thickness. In addition, plates having an intermediate thickness (60–100 mils, 0.15–0.25 cm) can be used as well as plates having a thickness greater than 250 mils (0.64 cm).

The base or support should be flexible and adhere well to the elastomeric layer. In addition, the base or support adds dimensional stability to the element.

Suitable base or support materials include metals, e.g., steel and aluminum plates, sheets and foils, and films or plates composed of various film-forming synthetic resins or high polymers such as the addition polymers and in particular vinylidene chloride copolymers with vinyl chloride, vinyl acetate, styrene, isobutylene and acrylonitrile; linear condensation polymers such as polyesters, e.g., polyethylene terephthalate, polycarbonate, polyamide, e.g., polyhexamethylene-sebacamide; polyimides, e.g., films as disclosed in Applicants' assignee's U.S. Pat. No. 3,179,634 and polyester amide. Non-reinforcing fillers or reinforcing agents can be present in the synthetic resin or polymer bases such as the various fibers (synthetic modified or natural), e.g., cellulosic fibers, for instance, cotton, cellulose acetate, viscose rayon, paper; glass wool; nylon and polyethylene terephthalate. These reinforced bases can be used in laminated form. In addition, the base can be subbed or surface treated to improve adhesion.

A transparent coversheet such as a thin film of polyester, polycarbonate, polyamide, fluoropolymers, polystyrene, polyethylene, polypropylene or other strippable material can be used to prevent contamination or damage to the surface to be laser engraved and is removed prior to laser engraving. The coversheet can also be subbed with a release layer. In addition, the coversheet can have a pattern and, thus, impart that pattern to the surface of the top layer.

Single layer, laser engravable flexographic printing elements described herein can be optionally treated to remove surface tackiness either before or after laser engraving. Suitable treatments which have been used to remove surface tackiness from styrene-diene block copolymers include treatment with bromine or chlorine solutions as described in Gruetzmacher et al., U.S. Pat. No. 4,400,459 and Fickes et al., U.S. Pat. No. 4,400,460; and light finishing, i.e., exposure to radiation sources having a wavelength not longer than 300 nm, as described in Gibson, U.S. Pat. No. 4,806,506, and European Patent EP 0 17 927, the disclosures of which are hereby incorporated by reference. It should be clear to those skilled in the art that such surface treatment does not constitute a photochemical or thermochemical reinforcement of the bulk layer.

In addition, these elements can be subjected to post-laser engraving treatments such as overall exposure to actinic radiation, heating or a combination thereof. Exposure to actinic radiation and/or heat is generally intended to complete the chemical hardening process. This is particularly true for the top and for the floor and sidewall surfaces which are created by laser engraving. It may be particularly advantageous to include a post-laser engraving treatment for photochemically reinforced plates.

The single layer, laser engravable flexographic elements of the invention can be prepared employing a variety of techniques which are well known in the art. One method which can be used, is to mix the components in an extruder, particularly a twin-screw extruder, and then extrude the mixture onto a support. To achieve uniform thickness the extrusion step can be advantageously coupled with a calendering step in which the hot mixture is calendered between two flat sheets or between one flat sheet and a release roll. Alternatively, the material can be extruded/calendered onto a temporary support and later laminated to the desired final support. It will be understood that for elements which are to be reinforced by a thermochemical hardening reaction, the temperature of the extrusion and calendering steps must be significantly lower than the temperature required to initiate the hardening reaction.

The elements can also be prepared by compounding the components in a suitable mixing device, e.g., a Banbury mixer, and then pressing the material into the desired shape in a suitable mold. The material is generally pressed between the support and coversheet, or between two temporary supports, followed by lamination onto the final desired support. The molding step can involve pressure and/or heat. As with the process above, it will be understood that for elements which are to be reinforced by a thermochemical hardening reaction, the temperature of the molding step must be significantly lower than the temperature required to initiate the thermochemical hardening reaction.

An alternative method is to dissolve and/or disperse the components in a suitable solvent and coat the mixture onto the support. The material can be coated as one layer or as a multiplicity of layers having the same composition. It is also possible to spray on a coating or coatings of the elastomeric layer onto a support. It will be understood that the choice of solvent will depend on the exact composition of the elastomeric material and other additives. Solvent coating or spraying may be preferred for elements which are to be thermochemically hardened.

For elements in which the elastomeric material is mechanically reinforced, the element is complete and ready for laser engraving after the material has been applied to the support. Optionally, the element can be detackified prior to laser engraving as discussed above.

For elements in which the elastomeric material is photochemically reinforced, the application of the elastomeric material to the support should be followed by exposure overall to actinic radiation to effect photohardening in depth prior to laser engraving. Overall exposure is important to effect photochemical reinforcement of the elastomeric layer. The source of the radiation should be chosen so that the wavelength emitted matches the sensitive range for the photoinitiator system. Typically, photoinitiator systems are sensitive to ultraviolet radiation. The radiation source then should furnish an effective amount of this radiation, preferably having a wavelength range between about 250 nm and 500 nm. In addition to sunlight, suitable high energy radiation sources include carbon arcs, mercury-vapor arcs, fluorescent lamps, electron flash units, electron beam units and photographic flood lamps. Mercury-vapor lamps, UV fluorescent tubes and sun lamps are suitable. Lasers can be used if the intensity is sufficient only to initiate photohardening, and not to ablate material. The exposure time will vary depending upon the intensity and spectral energy distribution of the radiation, its distance from the photosensitive material, and the nature and amount of the photosensitive composition. A removable coversheet can be present during the exposure step provided that it is removed after exposure and prior to laser engraving.

For elements in which the elastomeric material is thermochemically reinforced, the application of the elastomeric material to the support should be followed by a heating step prior to laser engraving to effect thermochemical reinforcement. The temperature of the heating step should be sufficient to thermochemically reinforce the elastomeric material and will depend on the nature of the thermal initiator and/or the reacting groups in the elastomeric material. As discussed above, the temperature should be adequate to effect thermochemical reinforcement without degrading the elastomeric material. Heating can be accomplished using any conventional heating means, e.g., an oven, microwave or IR lamp. The heating time will vary depending upon the temperature and the nature and amount of the thermally sensitive composition. A removable coversheet can be present during the heating step, so long as it can still be removed after heating and prior to laser engraving.

For elements in which both photochemical and thermochemical reinforcement are used, the element is both exposed to actinic radiation and heated to effect the reinforcement. The exposure and heating steps can be carried out in any order, including simultaneous heating and exposure.

In some cases, it may be desirable to prepare individual layers in the element by applying a multiplicity of thinner layers having the same composition. This can be particularly advantageous for layers which are reinforced photochemically. After the application of each thin layer the material can be exposed to actinic radiation to effect photochemical hardening of that thin layer. When laser radiation absorbing components and/or mechanical reinforcing agents have high optical density with respect to actinic radiation or act as inhibitors, e.g., carbon black are present in the layer, this may be desirable in order to effect photohardening. The inherent tackiness of the non-photohardened material is generally sufficient to insure that all of the thin layers remain firmly affixed together.

The top layer can be further treated to create a matte surface if this is desired for the laser engraved flexographic printing plate. The matte surface can be created by a variety of techniques which are well known, e.g., lamination to a patterned coversheet, embossing, surface etching with chemicals or lasers, the addition of small particles to the layer which protrude on the surface, etc.

EXAMPLES

Laser Engraving in Pulsed Mode

Samples were engraved in a pulsed mode on a test apparatus which consisted of a pulsed Nd:YAG laser, Spectra-Physics DCR-11 (Spectra-Physics Corp., Mountain View, Calif.), and a computer-controlled X-Z translation stage (Daedal Co., Harrison City, Pa.). The laser was operated in the long pulse mode, approximately 200 microsecond pulse duration, at 10 Hz repetition rate. The laser beam was focused with a 40 mm focal length lens, and impinged the sample held on the translation stage via vacuum. The X direction velocity of the stage was chosen so that translation during the laser repetition period of 100 milliseconds gave a suitable distance between individual laser pulses as shown below. Between successive horizontal (X direction) lines, the laser was shuttered and the translation stage was moved up (Z direction) by a predetermined distance. This gave a two dimensional pattern with relief depth.

The test conditions were as follows:

Test Pattern 1

- laser pulse energy=5 mJ
- X direction spacing=33 micrometers
- Z direction spacing=350 micrometers Test Pattern 2

- laser pulse energy=5 mJ
- X direction spacing=33 micrometers
- Z direction spacing=50 micrometers Test pattern 1 resulted in the formation of parallel channels in the sample. These were then profiled for shape and size using a Dektak 3030 profilometer (Veeco Instruments Inc., Santa Barbara, Calif.). These data supplied information regarding the image quality potential of the sample material.

Test pattern 2 resulted in the formation of a rectilinear cavity in the sample. The volume of this cavity was measured. The volume and the total laser energy delivered were used to calculate the average engraving efficiency as follows:

$$\text{Average engraving efficiency} = \frac{\text{cavity volume}}{\text{total energy}}\ \text{cm}^3/\text{kW-hr}$$

Laser Engraving in Continuous Wave Mode to form Flexographic Printing Plates Sample materials were engraved on a commercial laser engraving apparatus equipped with either a $CO_2$ or a Nd:YAG laser. In each case, the sample was mounted on the exterior of a rotating drum. For the $CO_2$ laser apparatus, the laser beam was directed parallel to the axis of the drum, and was directed toward the sample surface with a folding mirror mounted on a translation lead screw. For the Nd:YAG laser, the folding mirror was stationary and the drum moved parallel to its axis. The laser beam was then focused to impinge on the sample mounted on the drum. As the drum rotated and translated relative to the laser beam, the sample was exposed in a spiral fashion. The laser beam was modulated with image data, i.e., dots, lines and text characters with or without support structures, resulting in a two dimensional image with relief engraved into the sample material.

The relief depth was measured as the difference between the thickness of the floor and the thickness of the printing layer. The average engraving efficiency was also calculated.

Printing

Printing tests were carried out with the engraved plates on a Mark Andy press System 830 (Chesterfield, Mo.) using Film III Dense Black EC8630 ink (Environmental Inks &

Coatings, Morganton, N.C.) diluted with EIC Aqua Refresh EC1296 to a viscosity of 20 seconds as measured using a Zahn #2 cup. Printing was done on Hi Gloss 40FS S246 paper (Fasson, Painesville, Ohio). All samples were run at optimum impression as judged by the operator at 120 feet per minute. The plates were evaluated by determining the finest reverse line width, the highlight dot size and the halftone scale printed.

Example 1

A laser-engravable mechanically reinforced thermoplastic elastomeric layer was prepared from a styrene-isoprene-styrene block copolymer (Kraton® 1107, Shell Chemical Co., Houston, Tex.) which was precompounded with carbon black to a level of 10 phr in a Moriyama batch mixer. This blended mixture was fed into a 30 mm twin screw extruder and extruded at 182° C. between a polyethylene terephthalate support and a polyethylene terephthalate temporary protective sheet coated with a silicone release layer. Both the support and the temporary protective sheet had a thickness of 5 mil (0.013 cm). The total thickness of the layer, except for the protective sheet, was 104 mils (0.26 cm). The printing element had a Shore A hardness of 32.3 and a resilience of 42.3.

The protective sheet was removed prior to laser engraving. The results of the pulsed engraving tests showed that the printing element could be laser engraved with the formation of channels to a depth of 3 mils (0.0076 cm) with reasonably sharp shoulders. The average engraving efficiency was 450 $cm^3$/kW-hr.

Additional results are given in Tables 1 and 2 below. It should be noted that the element described above was evaluated under different laser engraving conditions (A-D).

Example 2

The laser-engravable mechanically reinforced thermoplastic elastomeric layer was prepared from a styrene-butadiene-styrene block copolymer (Kraton® 1102, Shell Chemical Co., Houston, Tex.) which was precompounded with carbon black to a level of 15 phr in a Moriyama batch mixer. The precompounded material was pressed in a mold between a polyethylene terephthalate support and a polyethylene terephthalate protective coversheet coated with a silicone release layer, to a final total thickness of 104 mils (0.26 cm), not including the protective coversheet.

The protective coversheet was removed prior to laser engraving. The results are given in Tables 1 and 2. It should be noted that the element described above was evaluated under different laser engraving conditions (A-C).

Example 3

The procedure of Example 2 was repeated using as the thermoplastic elastomeric material a styrene-ethylene/butylene-styrene block copolymer (Kraton® G, Shell Chemical Co., Houston, Tex.), and precompounding to a level of 15 phr. The results of the laser engraving tests are given in Tables 1 and 2 below. It should be noted that the element described above was evaluated under different laser engraving conditions (A-C).

Examples 4 and 5

The procedure of Example 2 was repeated using as the thermoplastic elastomeric material a copolymer of ethylene/n-butyl acrylate/carbon monoxide (Elvaloy® HP, E. I. du Pont de Nemours and Co., Wilmington, Del.), and precompounding to a level of 25 phr (Example 4) and 15 phr (Example 5). The results of the laser engraving tests are given in Tables 1 and 2 below. It should be noted that the element described in Example 5 was evaluated under different laser engraving conditions (A-D).

TABLE 1

| Example | Laser | Mode[a] | Power | Engraving Efficiency[b] |
|---|---|---|---|---|
| 1A | $CO_2$ | CW | 320W | 450 |
| 1B | YAG | CW | 35W | 864 |
| 1C | YAG | P | 25W | 453 |
| 1D | YAG | P | 125W | 439 |
| 2A | $CO_2$ | CW | 600W | 403 |
| 2B | YAG | P | 5W | 828 |
| 2C | YAG | P | 25W | 1385 |
| 3A | $CO_2$ | CW | 600W | 891 |
| 3B | YAG | P | 5W | 1061 |
| 3C | YAG | P | 25W | 1747 |
| 4 | YAG | CW | 30W | 413 |
| 5A | $CO_2$ | CW | 400W | 429 |
| 5B | YAG | CW | 30W | 431 |
| 5C | YAG | P | 5W | 663 |
| 5D | YAG | P | 25W | 1312 |

[a]CW = continuous wave
P = pulsed
[b]in $cm^3$/kW-hr

TABLE 2

| | Image on Plate | | Printing Results | | |
|---|---|---|---|---|---|
| Example | Line[a] Width | Dot[b] Size | Line[a] Width | Dot[b] Size | Halftone Scale |
| 1A | 350 | 280 | 150 | 310 | 4–95% |
| 1B | 390 | — | 200 | 220 | 50–95% |
| 1C | 200 | 150 | — | — | — |
| 1D | 275 | 75 | — | — | — |
| 2A | 339 | 120 | — | — | — |
| 2B | 150 | 30 | — | — | — |
| 2C | 200 | 40 | — | — | — |
| 3A | 538 | 100 | — | — | — |
| 3B | 155 | 30 | — | — | — |
| 3C | 200 | 50 | — | — | — |
| 4 | 200 | 300 | — | — | — |
| 5A | 317 | 100 | — | — | — |
| 5B | 225 | 225 | — | — | — |
| 5C | 155 | 50 | — | — | — |
| 5D | 214 | 110 | — | — | — |

[a]Reverse line width in micrometers
[b]Highlight dot size in micrometers

Example 6

This example illustrates the process of the invention in which a laser-engraved flexographic printing plate is further surface detackified by light finishing.

A mechanically reinforced printing element was prepared as described in Example 1. The element was engraved using a $CO_2$ laser operating in the continuous wave mode with a power of 550 W. The surface of the engraved plate was tacky. The plate was then light finished in a Du Pont Cyrel® Light Finish/Post Exposure unit (E. I. du Pont de Nemours and Co., Wilmington, Del.), for 10 minutes. The light-finished plate was not tacky to the touch. After several days time, visual examination showed much less dust and lint accumulation on the surface of the plate which had been light finished.

The analysis of the image on the plate and the printing results are given in the Table 3 below.

TABLE 3

| Sample | Reverse Line Width[a] | Highlight Dot Size[a] | Halftone Scale |
|---|---|---|---|
| Image on Plate | 180 | 180 | — |
| Printing Results | 90 | 300 | 20–90% |

[a]in micrometers

Example 7

This example illustrates the use of an elastomeric material which is both mechanically and photochemically reinforced to form a single layer laser-engravable flexographic printing element.

Carbon black was precompounded with a styrene-isoprene-styrene block copolymer (Kraton® 1107) to a level of 10 phr in a Moriyama batch mixer. A mixture of the following components:

| Component | Amount (g) |
|---|---|
| Styrene-butadiene-styrene block copolymer (Kraton ® 1102) | 161 |
| Styrene-isoprene-styrene block copolymer with 10 phr C (from above) | 4.6 |
| 1,6-Hexanediol diacrylate | 30 |
| Butyrated hydroxytoluene | 3 |
| 2-Phenyl-2,2-dimethoxy acetophenone | 9 |

was milled in a hot milling device with 60 g methylene chloride at 150° C. for 15 minutes. The milled mixture was hot pressed between a 5 mil (0.013 cm) flame treated polyester support and a 5 mil (0.013 cm) polyester cover-sheet which had been precoated with a silicone release layer, to form a 30 mil (0.076 cm) elastomeric layer. The layer was photochemically reinforced by overall exposure to actinic radiation on both sides in a Cyrel® 30×40 exposure unit (E. I. du Pont de Nemours and Co., Wilmington, Del.) for 10 minutes. The resulting printing element was glossy and tack free.

The element was laser engraved with a pulsed Nd:YAG laser using test patterns 1 and 2. The channel width was 4.16 mils (0.011 cm); the depth was 0.4 mil (0.0010 cm); the engraving efficiency was 17 $cm^3$/kW-hr.

What is claimed is:

1. A laser engravable, single-layer flexographic printing element which comprises:
   (a) a flexible support; and
   (b) a laser engravable, reinforced elastomeric layer wherein said layer has been singly reinforced mechanically or thermochemically or multiply reinforced mechanically and photochemically, mechanically and thermochemically, or photochemically and thermochemically, or mechanically, photochemically and thermochemically provided that thermochemical reinforcement is accomplished using a crosslinker other than sulfur, a sulfur containing moiety, or peroxide; said elastomeric layer being at least 0.05 cm thick and capable of being laser engraved to a depth of at least 0.005 cm after reinforcement.

2. An element according to claim 1 which further comprises (c) a removable coversheet.

3. An element according to claim 1 wherein at least one laser radiation absorbing component is added to the elastomeric layer.

4. An element according to claim 3 wherein the laser radiation absorbing component is carbon black.

5. An element according to claim 1 or 2 wherein said element can be surface detackified either before or after laser engraving.

6. A laser engravable, single-layer flexographic printing element which comprises:
   (a) a flexible support; and
   (b) a laser engravable, reinforced elastomeric layer wherein said layer comprises at least one thermoplastic elastomer, said layer being singly reinforced mechanically or thermochemically or multiply reinforced mechanically and photochemically, mechanically and thermochemically, photochemically and thermochemically or mechanically, photochemically and thermochemically, said elastomeric layer being at least 0.05 cm thick and capable of being laser engraved to a depth of at least 0.005 cm after reinforcement.

* * * * *